(12) United States Patent
Lee

(10) Patent No.: US 6,313,044 B1
(45) Date of Patent: Nov. 6, 2001

(54) METHODS FOR FORMING A SPIN-ON-GLASS LAYER

(75) Inventor: Seung Jin Lee, Ichon (KR)

(73) Assignee: Hyundai Electronics Industries Co., Ltd. (KR)

(*) Notice: Subject to any disclaimer, the term of this patent is extended or adjusted under 35 U.S.C. 154(b) by 0 days.

(21) Appl. No.: 09/364,330

(22) Filed: Jul. 30, 1999

(30) Foreign Application Priority Data

Oct. 29, 1998 (KR) .................................................. 98-45677

(51) Int. Cl.⁷ ............................................. H01L 21/469
(52) U.S. Cl. ............................................. 438/758; 427/294
(58) Field of Search ...................................... 427/489, 294, 427/553; 524/317; 438/795, 781, 782, 758

(56) References Cited

U.S. PATENT DOCUMENTS

| | | |
|---|---|---|
| 5,314,724 * | 5/1994 | Tsukune et al. ................. 427/489 |
| 5,328,871 | 7/1994 | Tanigawa et al. . |
| 5,604,380 | 2/1997 | Nishimura . |
| 5,605,867 | 2/1997 | Sato et al. . |
| 5,650,041 | 7/1997 | Gotoh et al. . |
| 5,665,845 | 9/1997 | Allman . |
| 5,723,264 | 3/1998 | Robello et al. . |
| 5,728,630 | 3/1998 | Nishimura et al. . |
| 5,759,923 | 6/1998 | McMillian et al. . |
| 5,840,821 | 11/1998 | Nakano et al. . |
| 5,855,962 | 1/1999 | Cote et al. . |
| 5,883,011 | 3/1999 | Lin et al. . |
| 5,889,330 | 3/1999 | Nishimura et al. . |
| 5,998,522 * | 12/1999 | Nakano et al. ................. 524/315 |
| 6,162,745 * | 12/2000 | Ito et al. ......................... 438/795 |

FOREIGN PATENT DOCUMENTS

| | | |
|---|---|---|
| 63-158853 | 7/1988 | (JP) . |
| 3-155631 | 7/1991 | (JP) . |
| 3-261145 | 11/1991 | (JP) . |
| 3-287163 | 12/1991 | (JP) . |
| 4-131853 | 5/1992 | (JP) . |
| 4-153651 | 5/1992 | (JP) . |
| 4-174342 | 6/1992 | (JP) . |
| 10-209136 | 8/1998 | (JP) . |

* cited by examiner

Primary Examiner—David Nelms
Assistant Examiner—David Vu
(74) Attorney, Agent, or Firm—Blakely Sokoloff Taylor & Zafman

(57) ABSTRACT

There is provided a method for forming a SOG layer, which can enhance flatness. In the method, the SOG layer is spin-coated on a wafer and the SOG solvent is spread in a closed receptacle containing the wafer to make a saturated vapor pressure in the receptacle. Thus, the SOG layer can be more flattened and be obtained with larger thickness than that of the prior art to enhance the productivity. The present invention can also maximally suppress the production of edge beads generated by spin coating and inhibit the bowing generated during etching of the SOG layer for forming a contact hole, with enhancing the flatness.

17 Claims, 4 Drawing Sheets

Mean: 3310.52 Å
Minimum: 3148.45 Å
Maximum: 3417.54 Å
Range: 269.09

− REGION BELOW AVERAGE THICKNESS
+ REGION OVER AVERAGE THICKNESS

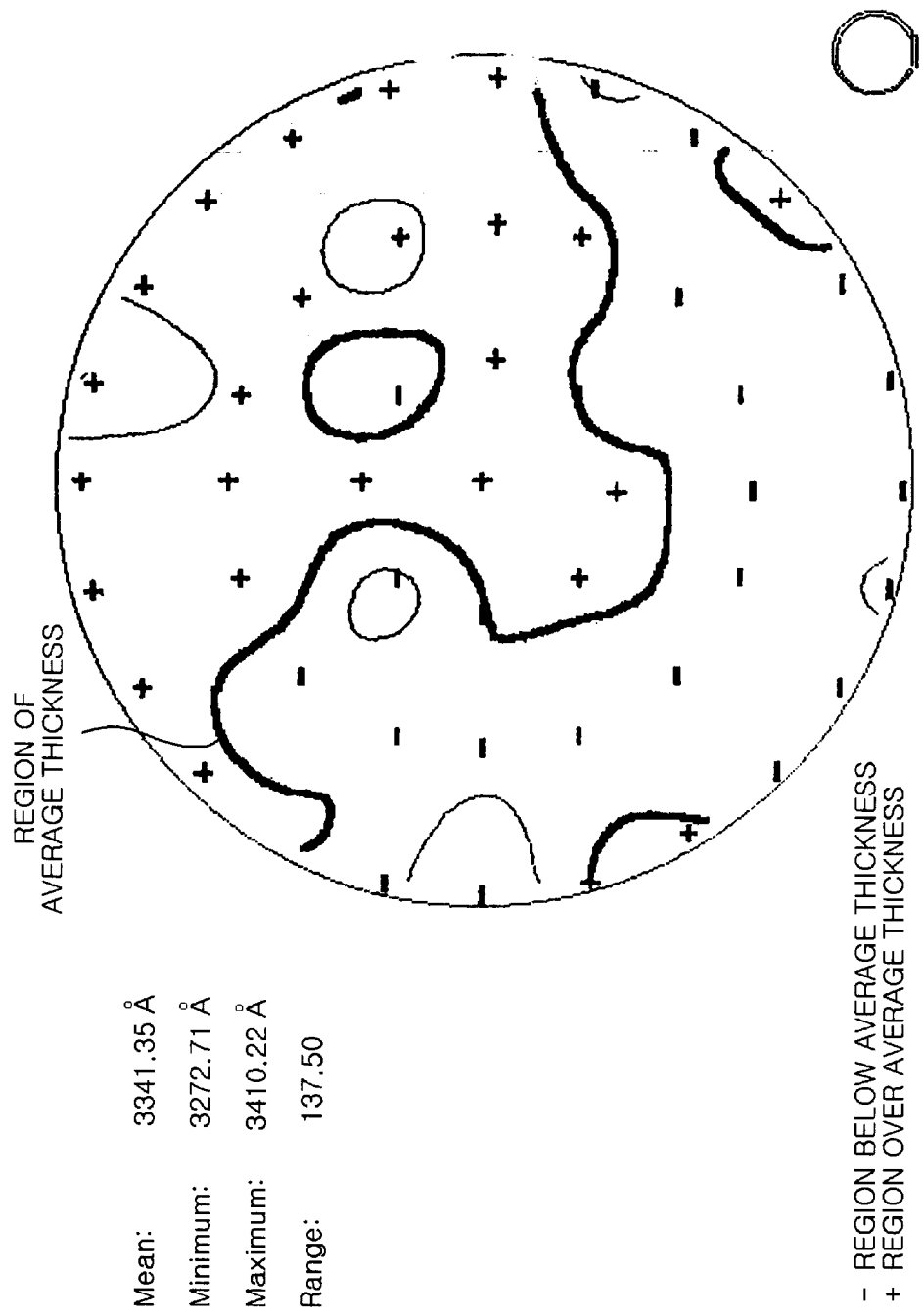

METHODS FOR FORMING A SPIN-ON-GLASS LAYER

FIELD OF THE INVENTION

The present invention relates to a field of manufacturing a semiconductor device; and, more particularly, to methods for forming a spin-on-glass layer, which can enhance the flatness of the spin-on-glass layer (hereinafter, referred to as SOG layer) as an interlayer insulating layer and its productivity.

DESCRIPTION OF THE PRIOR ART

Generally, a SOG layer is formed by spin coating. Before spin coating, SOG solution is formed by dissolving or suspending siloxane or silicate into solvent. The formed SOG solution is then spin-coated on a wafer by spreading it through nozzle to form the SOG layer. Thereafter, the coated layer is baked or cured for condensation.

FIG. 1 is a sectional view showing an open receptacle for forming the SOG layer according to the prior art. A wafer-supporting bar 20 is set up in the open receptacle 10. It is also shown that a wafer 30 is placed on a supporting plate connected to the supporting bar. In the case of using the open receptacle for spin coating, the coating is performed under normal pressure.

It is a present-coming situation that the aspect ratio in a multiple-layer metal structure becomes high with high integration trend of semiconductor devices. Although the burial of via and flatness can be accomplished using the inherent flowage of SOG solution, the flatness is not completely accomplished even after spin-coating the SOG layer.

Furthermore, the thickness of the SOG layer formed by one time of the spin coating is restricted to below some value since the coated SOG solution loses its flowage during spin coating process. For example, it is difficult to form a SOG layer with the thickness of more than 2000Å by one time of spin coating, when the SOG layer is formed from siloxane or its derivative solution. So, in the prior art, after a first SOG layer 51 is formed on a wafer 30 having a metal wiring pattern 40 (as shown in FIG. 2a), a second SOG layer 52 is formed on the first SOG layer 51 (as shown in FIG. 2b). That is to say, the number of spin coating should be determined according to the thickness of the needed SOG layer. For example, when the thickness of the needed SOG layer is larger than 2000Å, the number of spin coating should increase one time or more.

As described above, in order to form the needed thickness of the SOC layer, the spin coating should be performed with several times. Thus, there is a problem in the prior art that repeating the same process decreases the productivity.

There is also another problem that when a contact hole is formed at subsequent process, bowing is produced at the sidewall of the contact hole due to etching residual material. The problem is caused from the thicker portion of the SOG layer on the metal wiring than the other portion, the thicker portion being resulted from insufficient flattening.

There is still another problem that the conventional spin coating produces edge beads, which increase the probability of breaking the wafer at the portion during subsequent processes.

SUMMARY OF THE INVENTION

It is, therefore, an object of the present invention to provide a method for forming a SOG layer, which can enhance flatness.

It is, also, another object of the present invention to provide a method for forming a SOG layer, which can maximally suppress the production of edge beads generated by spin coating and inhibit the bowing generated during etching of the SOG layer for forming a contact hole, with enhancing the flatness.

It is, still also, another object of the present invention to provide a method for forming a SOG layer which can form the thicker SOG layer than the prior art and thus, form the needed thickness of the SOG layer only by one time of spin coating, with enhancing the flatness.

In accordance with an embodiment of the present invention, there is provided a method for forming a spin-on-glass (SOG) layer for flattening a semiconductor device, the method comprising the steps of spin-coating SOG solution on a wafer to form the SOG layer (first step); and, spreading SOG solvent in a closed receptacle containing the wafer and making a saturated vapor pressure in the receptacle with spinning to allow the surface of the SOG layer to become flat (second step).

According to the method of the present invention, the SOG layer is spin-coated on a wafer and the SOG solvent is spread in a closed receptacle containing the wafer to make a saturated vapor pressure in the receptacle; thus, the thickness of the SOG layer can increase and the flatness of the SOG layer can be enhanced.

BRIEF DESCRIPTION OF THE DRAWINGS

The above and other objects and features of the present invention will become apparent from the following description of preferred embodiments given in conjunction with the accompanying drawings, in which:

FIG. 5b shows the distribution of the thickness of the whole SOG layer formed by the method of the present invention using ethereal solvent as a SOG solvent.

DETAILED DESCRIPTION OF THE PREFERRED EMBODIMENTS

The invention will be illustrated in detail by the following preferred embodiment with reference to the accompanying drawings.

Figure 1:
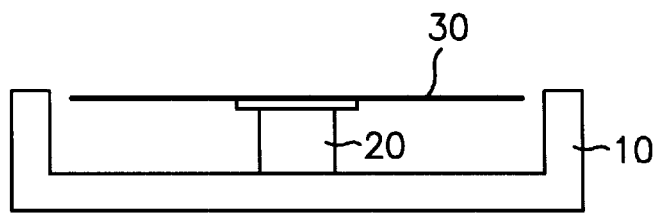
FIG. 1 is a sectional view of the receptacle for forming the SOG layer according to the prior art.
Figure 2A:
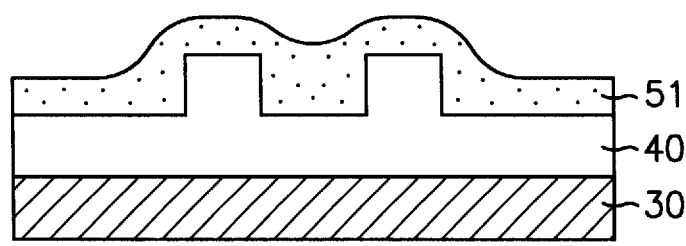
FIGS. 2a and 2b are sectional views showing the SOG layer formed by two times of spin-coating according to the prior art.
Figure 2B:
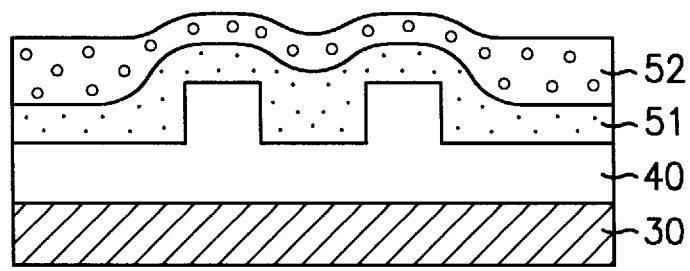
Figure 3:
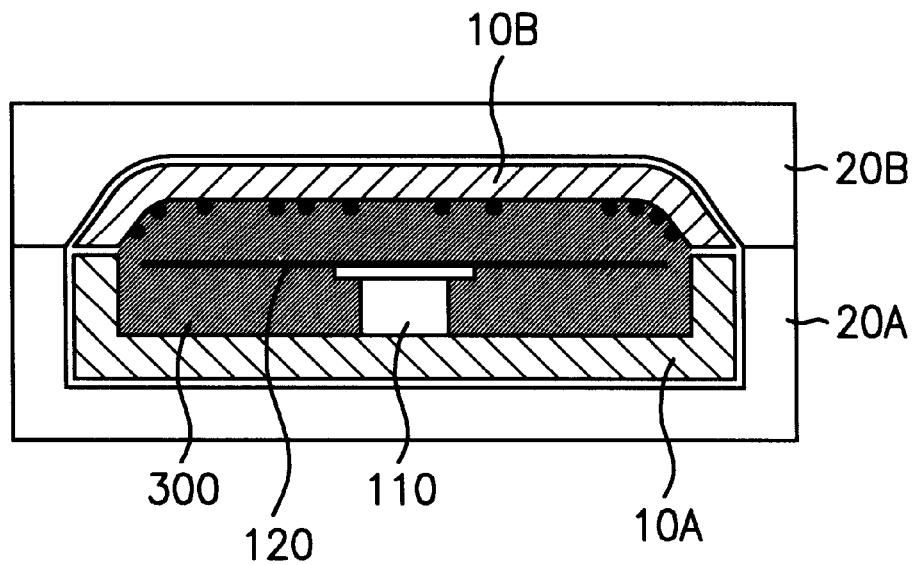
FIG. 3 is a sectional view of the receptacle for forming the SOC layer according to an embodiment of the present invention.

FIG. 3 is a sectional view of the receptacle for forming the SOG layer according to an embodiment of the present invention. Referring to FIG. 3, a wafer supporting bar 110 is set up in an internal receptacle 10A. A wafer is placed on a supporting plate connected to the supporting bar 110. An internal cover 10B is placed on the internal receptacle 10A to form a closed space including the wafer. An external receptacle 20A is placed outside the internal receptacle 10A. An external cover 20B is also placed on the external receptacle 20A. Thus, the external receptacle and cover enclose the internal receptacle and cover, respectively.

As shown in the drawing, the wafer 120 is fastened on the supporting plate connected to the wafer supporting bar 110 and SOG solution is spread onto the wafer through nozzle (not shown) and spin-coated on the wafer. SOG solvent is spread through nozzle in the internal receptacle and make a saturated vapor pressure in the closed space enclosed with the internal receptacle 10A and the internal cover 10B. At this time, spreading the solvent saturated in the closed space may be performed simultaneously with coating the SOC solution, before coating or after coating.

In the present invention, after a first insulating layer is formed on the wafer, the SOG layer may be formed as a second insulating layer on the first insulating layer. A third insulating layer may be also formed on the SOG layer. Wherein the first insulating layer and the third insulating layer may be conventional insulating layers such as layers of silicon oxide, silicon nitride or silicon oxynitride.

The SOG is, preferably, organic silicone having side chains consisted of $C_xH_{2x+1}$ (here, x is a natural number) group. The SOG solvent is, preferably, ethereal material. In the embodiment of the present invention, propylene glycol dimethyl ether was used as a SOG solvent. However, alcoholic material can be used as a SOG solvent in the present invention, though it is not as good as the ethereal solvent in the performance.

With the saturation of the SOG solvent in the closed space enclosed with the internal receptacle 10A and the internal cover 10B, since the SOG is dissolved again by the solvent so as not to lose the flowage of the SOG layer, it is possible continuously to spin-coat the SOG solution on the wafer.

Subsequently, it is preferable that the coated SOG layer should be cured at a temperature of 300° C. to 500° C.

Figure 4:
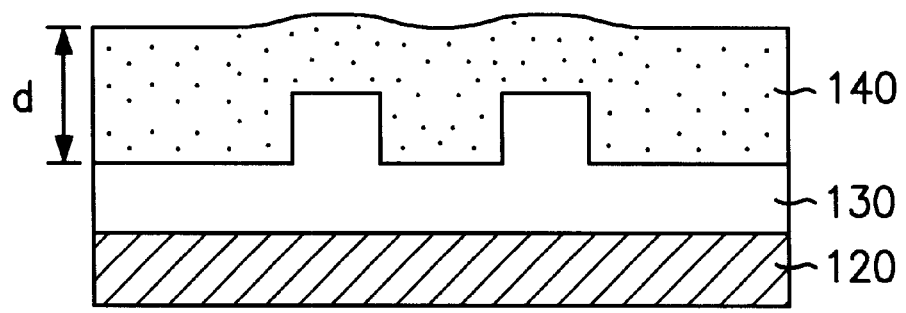
FIG. 4 is a sectional view showing the SOG layer formed according to the, embodiment of the present invention.

FIG. 4 shows the SOG layer 140 formed on the wafer in the process as described above. According to the method of the present invention, the SOG layer 140 can be formed with the larger thickness d than that of the prior art by one time of spin coating and be enhanced in its flatness.

Figure 5A:
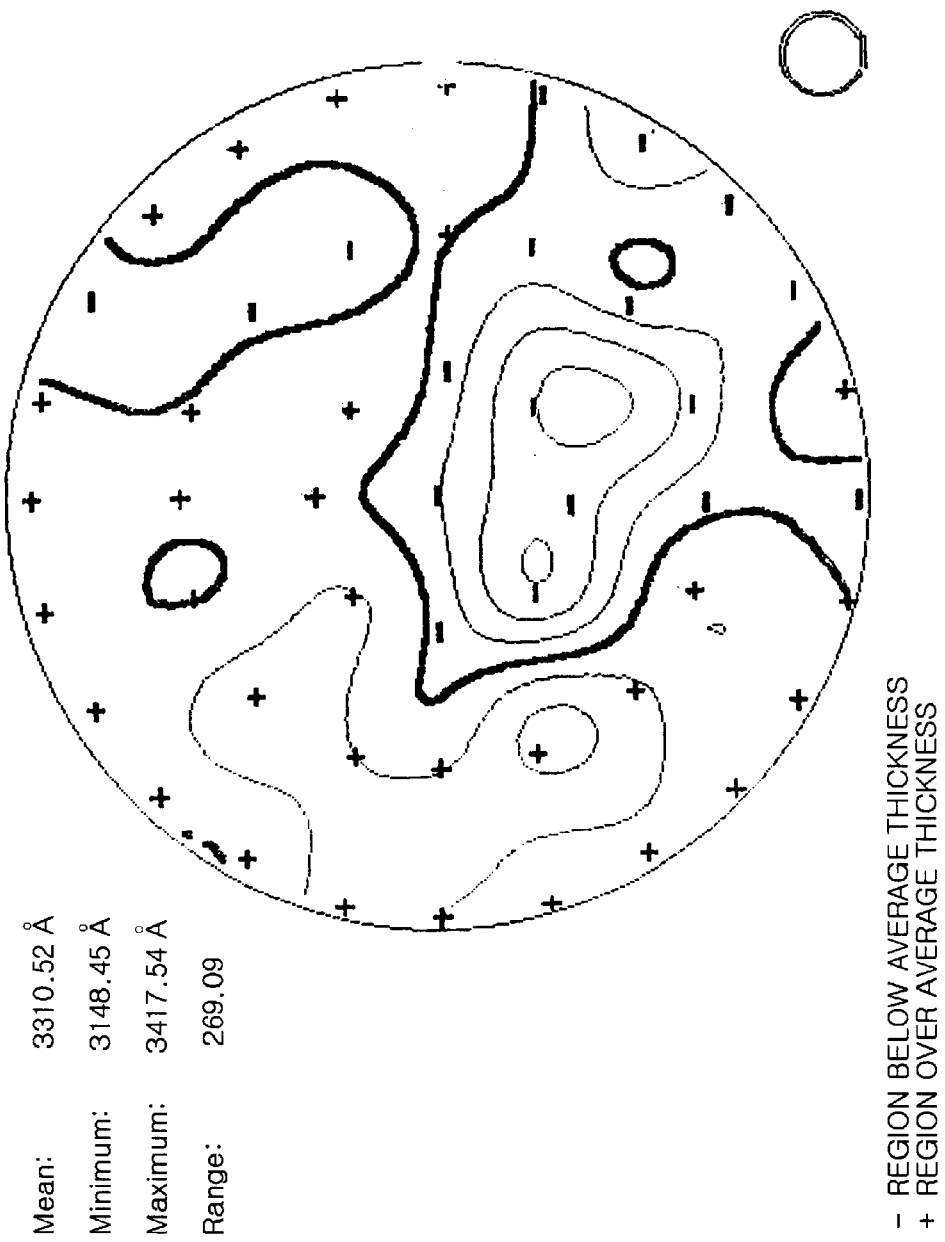
FIG. 5a shows the distribution of the thickness of the whole SOC layer formed by the method of the present invention using alcoholic solvent as a SOG solvent.

FIG. 5a shows the distribution of the thickness of the whole SOG layer formed by the method of the present invention using alcoholic solvent as a SOG solvent. FIG. 5b also shows the distribution of the thickness of the whole SOG layer formed by the method of the present invention using ethereal solvent as a SOG solvent. The following table compares the thickness and the uniformity of the SOG layer in the case of using alcoholic material as a solvent according to the measured results of FIG. 5a with those in the case of using ethereal material as a solvent according to the measured results of FIG. 5b. Wherein the used alcoholic solvent is isopropyl alcohol, the ethereal solvent is propylene glycol dimethyl ether, and the SOG material is AG-211 (polymethylsiloxane type material, supplied by Allied Signal Co., USA).

|  | Alcoholic Solvent | Ethereal Solvent |
| --- | --- | --- |
| Average thickness of the SOG layer | 3310.52Å | 3341.35Å |
| Minimum thickness | 3148.45Å | 3272.71Å |
| Maximum thickness | 3417.54Å | 3410.22Å |
| Maximum − Minimum | 269.09Å | 137.50Å |
| Uniformity of thickness | 4% | 2% |

In the above table, the uniformity of the thickness is obtained using the following mathematical formula. Wherein the smaller the uniformity is, the better the flatness is.

Uniformity of the thickness (%)={(Maximum thickness−Minimum thickness)/(2×Average thickness)}×100

Both of the above results show that the SOG layer can be formed with larger thickness than that of prior art by one time of spin coating. The results also show that the layer thickness is larger in the case of using ethereal solvent than in the case of using alcoholic solvent and the uniformity of the layer thickness is more enhanced in the former case than in the latter case.

While the present invention has been described with respect to certain preferred embodiments only, other modifications and variations may be made without departing from the spirit and scope of the present invention as set forth in the following claims.

What is claimed is:

1. A method for forming a spin-on-glass (SOG) layer for flattening a semiconductor device, the method comprising the steps of:
    spin-coating SOG solution on a wafer to form the SOG layer (first step); and
    spreading SOG solvent in a closed receptacle containing the wafer and making a saturated vapor pressure in the receptacle with spinning to allow the surface of the SOG layer to become flat (second step).

2. The method according to claim 1, wherein all of the first step and the second step are performed in the closed receptacle.

3. The method according to claim 1, wherein spreading the SOG solvent is performed simultaneously with coating the SOG layer, before coating or after coating.

4. The method according to claim 1, wherein the SOG solvent is ethereal material or alcoholic material.

5. The method according to claim 2, wherein the SOG solvent is ethereal material or alcoholic material.

6. The method according to claim 1, wherein the SOG solvent is propylene glycol dimethyl ether.

7. The method according to claim 2, wherein the SOG solvent is propylene glycol dimethyl ether.

8. The method according to claim 1, wherein after flattening the SOG layer, the method further comprises the step of curing the SOG layer at 300° C. to 500° C.

9. The method according to claim 2, wherein after flattening the SOG layer, the method further comprises the step of curing the SOG layer at 300° C. to 500° C.

10. The method according to claim 1, wherein the SOG is made of organic silicone having side chains consisted of $C_xH_{2x+1}$ (here, x is a natural number) group.

11. The method according to claim 2, wherein the SOG is made of organic silicone having side chains consisted of $C_xH_{2x+1}$ (here, x is a natural number) group.

12. The method according to claim 1, wherein the method further comprises the steps of:
    forming a first insulating layer on the wafer before forming the SOG layer as a second insulating layer; and
    optionally forming a third insulating layer on the SOG layer, Wherein the SOG layer is formed as the second layer on the first insulating layer.

13. The method according to claim 2, wherein the method further comprises the steps of:
    forming a first insulating layer on the wafer before forming the SOG layer as a second insulating layer; and
    optionally forming a third insulating layer on the SOG layer, Wherein the SOG layer is formed as the second layer on the first insulating layer.

14. The method according to claim 12, wherein the first insulating layer and the third insulating layer are layers of silicon oxide, respectively.

15. The method according to claim 13, wherein the first insulating layer and the third insulating layer are layers of silicon oxide, respectively.

16. The method according to claim 12, wherein the first insulating layer and the third insulating layer are layers of silicon oxynitride, respectively.

17. The method according to claim 13, wherein the first insulating layer and the third insulating layer are layers of silicon oxynitride, respectively.

* * * * *